United States Patent
Klein et al.

(10) Patent No.: US 10,204,678 B2
(45) Date of Patent: Feb. 12, 2019

(54) MULTI-STATE MAGNETIC MEMORY DEVICE

(71) Applicants: NEW YORK UNIVERSITY, New York, NY (US); BAR-ILAN UNIVERSITY, Ramat Gan (IL)

(72) Inventors: Lior Klein, Ramat Gan (IL); Yevgeniy Telepinsky, Ramat Gan (IL); Mordechai Schultz, Ramat Gan (IL); Andrew David Kent, New York, NY (US); Yu-Ming Hung, New York, NY (US)

(73) Assignees: NEW YORK UNIVERSITY, New York, NY (US); BAR-ILAN UNIVERSITY, Ramat Gan (IL)

( * ) Notice: Subject to any disclaimer, the term of this patent is extended or adjusted under 35 U.S.C. 154(b) by 0 days.

(21) Appl. No.: 15/466,657

(22) Filed: Mar. 22, 2017

(65) Prior Publication Data
US 2017/0278567 A1 Sep. 28, 2017

Related U.S. Application Data

(60) Provisional application No. 62/311,939, filed on Mar. 23, 2016, provisional application No. 62/325,496, filed on Apr. 21, 2016.

(51) Int. Cl.
*G11C 11/56* (2006.01)
*G11C 11/16* (2006.01)
(Continued)

(52) U.S. Cl.
CPC ........ *G11C 11/5607* (2013.01); *G11C 11/161* (2013.01); *G11C 11/1653* (2013.01);
(Continued)

(58) Field of Classification Search
CPC ...... H01L 43/02; H01L 27/222; G11C 11/161
See application file for complete search history.

(56) References Cited

U.S. PATENT DOCUMENTS

| | | | | |
|---|---|---|---|---|
| 6,956,764 B2 * | 10/2005 | Engel | ...................... | G11C 11/16 365/158 |
| 7,054,186 B2 * | 5/2006 | Iwata | ...................... | G11C 11/16 365/158 |

(Continued)

OTHER PUBLICATIONS

Fal, T.J., et al., "Hexagonal ferrites for use in microwave notch filters and phase shifters", J. Appl. Phys., Jul. 24, 2008, 104:023910-1-023910-9.

(Continued)

*Primary Examiner* — David Spalla
(74) *Attorney, Agent, or Firm* — Foley & Lardner LLP

(57) ABSTRACT

A multi-state MRAM device comprises N overlapping ovals defining a free ferromagnetic region. The size of the free ferromagnetic region is controlled the shape anisotropy of the configuration via at least a aspect ratio greater than 2, of the free ferromagnetic region. The free ferromagnetic region has a magnetic moment spontaneously aligned along the long axis in each oval outside the center region. A center magnetic moment has a multitude of exactly 2*N stable orientations determined by the magnetic moments in the segments of the ovals outside the center region. An embodiment is an MRAM device using tunneling junctions to achieve a multi-state memory configuration. Certain embodiments includes an electrically conducting heavy-metal layer disposed adjacent to and connected with the free ferromagnetic region. Some embodiments include a topological insulating material, such as $Bi_2Se_3$. Magnetic moment reversal in the ovals may be determined by spin-transfer torque associated with the electrically conducting layer.

20 Claims, 5 Drawing Sheets

(51) Int. Cl.
    H01L 43/02    (2006.01)
    H01L 27/22    (2006.01)
    H01L 43/08    (2006.01)
    H01L 43/10    (2006.01)
    H01L 43/12    (2006.01)
    G11C 11/18    (2006.01)

(52) U.S. Cl.
    CPC ...... *G11C 11/1655* (2013.01); *G11C 11/1657* (2013.01); *G11C 11/1659* (2013.01); *G11C 11/1675* (2013.01); *G11C 11/18* (2013.01); *H01L 27/228* (2013.01); *H01L 43/08* (2013.01); *H01L 43/12* (2013.01)

(56) References Cited

U.S. PATENT DOCUMENTS

| | | | |
|---|---|---|---|
| 7,095,646 B2 | 8/2006 | Slaughter et al. | |
| 7,173,848 B2* | 2/2007 | Ju .......................... | G11C 11/16 365/158 |
| 2006/0267056 A1* | 11/2006 | Ju .......................... | G11C 11/15 257/295 |

OTHER PUBLICATIONS

Hung, Y-M, et al., "Quasistatic and Pulsed Current-Induced Switching With Spin-Orbit Torques in Ultrathin Films with Perpendicular Magnetic Anisotropy", IEEE Magn. Let., 2015, 6:3000504-1-3000504-4.

Imre, A., et al., "Flux-Closure Magnetic States in Triangular Cobalt Ring Elements", IEEE Trans. Magn., Nov. 2006, 42(11):3641-3644.

Information Technology Laboratory/National Institute of Standards and Technology, "The Object Oriented MicroMagnetic Framework (OOMMF) project at ITL/NIST", <http://math.nist.gov/oommf/>, created Aug. 28, 2006, 2 pages.

Kent, A.D., et al., "A new spin on magnetic memories", Nat. Nanotechnol., Mar. 2015, 10:187-191.

Klaui, M., et al., "Domain wall motion induced by spin polarized currents in ferromagnetic ring structures", Appl. Phys. Lett., Jul. 7, 2003, 83(1):105-107.

Liu, L., et al., "Spin-Torque Switching with the Giant Spin Hall Effect of Tantalum", Science, May 6, 2012, 336(6081):555-558.

Mani, A.S., et al., "Effect of Controlled Asymmetry on the Switching Characteristics of Ring-Based MRAM Design", IEEE Trans. Nanotechnol., May 2006, 5(3):249-254.

Miron, I.M., et al., "Perpendicular switching of a single ferromagnetic layer induced by in-plane current injection", Nature, Aug. 11, 2011, 476:189-194.

Radwanski, R.J., "The origin of the basal-plane magnetocrystalline anisotropy in 4f Co-rich intermetallics", J. Phys. F: Met Phys., 1987, 17:267-276.

Vansteenkiste, A., et al., "The design and verification of MuMax3", AIP Adv., 2014, 4:107133-1-107133-22.

Vitol, E.A., et al., "Multifunctional ferromagnetic disks for modulating cell function", IEEE Trans. Magn., Nov. 1, 2012, 48(11):3269-3274.

Wang, A., et al., "Determination of the in-plane anisotropy field in hexagonal systems via rotational magnetization: Theoretical model and Monte Carlo simulations", Sci China Ser G-Phys Mech Astron, Jul. 2009, 52(7):978-986.

West, F.G., "Rotating-Field Technique for Galvanomagnetic Measurements", J. Appl. Phys., Apr. 1963, 34(4):1171-1173.

* cited by examiner

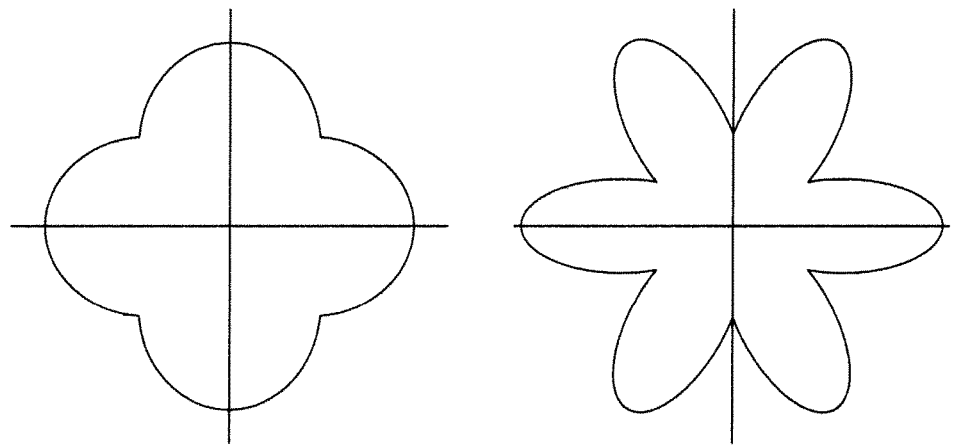
FIG. 1A
(Prior Art)
FIG. 1B
(Prior Art)
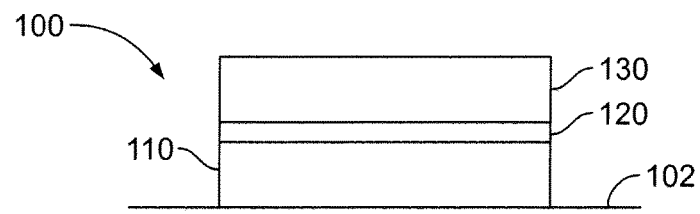
FIG. 2A
FM1        FM2
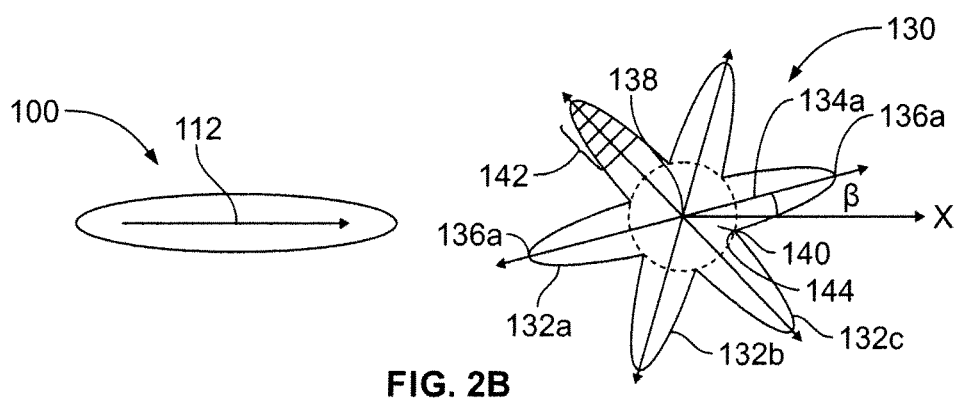
FIG. 2B

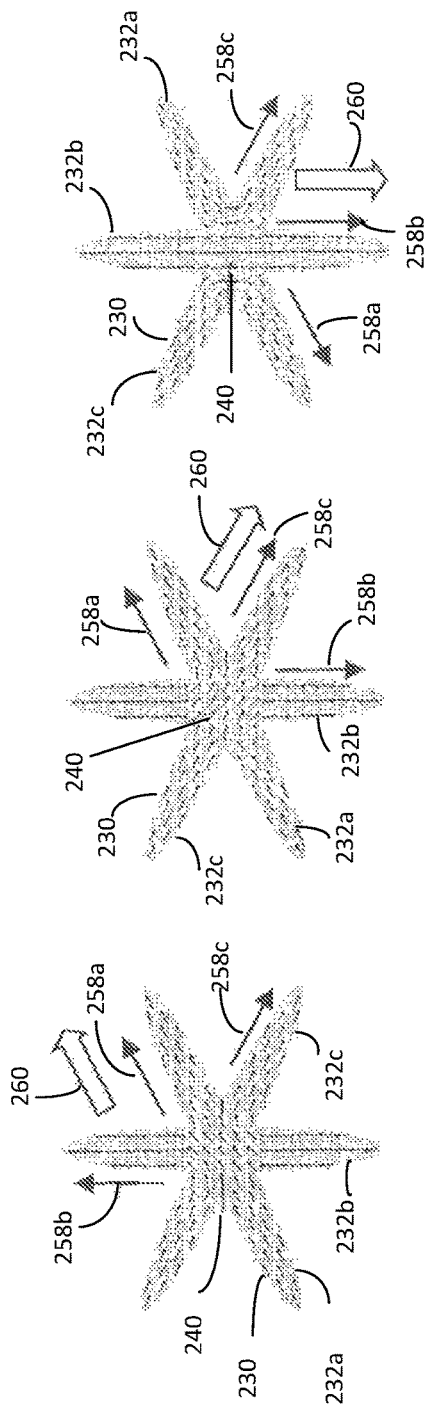
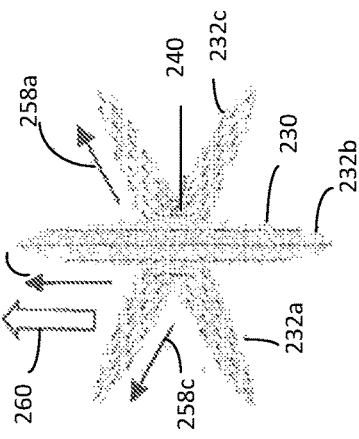
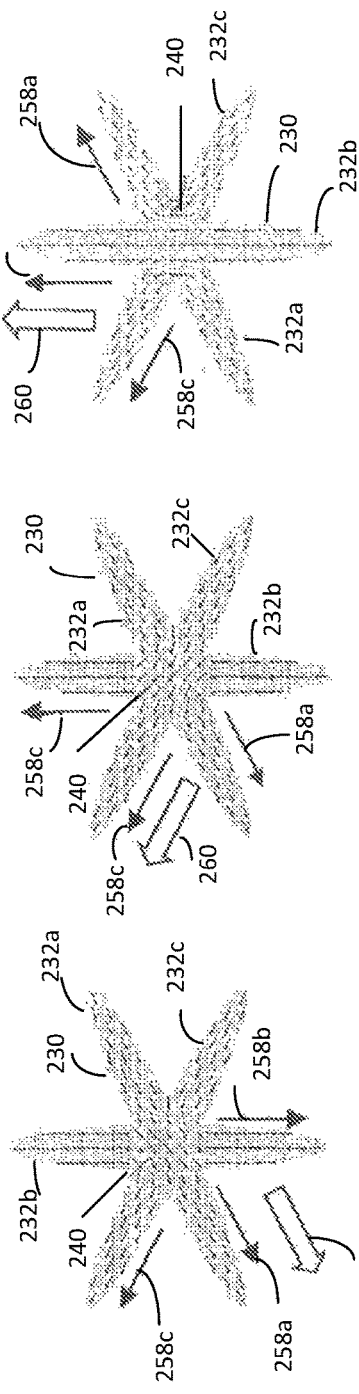
Fig. 3A  Fig. 3B  Fig. 3C
Fig. 3D  Fig. 3E  Fig. 3F

MULTI-STATE MAGNETIC MEMORY DEVICE

CROSS-REFERENCE TO RELATED PATENT APPLICATIONS

This application claims priority to U.S. Provisional Patent Application No. 62/311,939, entitled "MULTI-STATE MAGNETIC MEMORY DEVICE," by Klein et al., filed on Mar. 23, 2016, which is herein incorporated by reference in its entirety. This application also claims priority to U.S. Provisional Patent Application No. 62/325,496, entitled "MULTI-STATE MAGNETIC MEMORY DEVICE," by Klein et al., filed on Apr. 21, 2016, which is herein incorporated by reference in its entirety.

FIELD OF THE INVENTION

The invention, in some embodiments, relates to multi-state magnetic memory devices.

BACKGROUND

Conventionally, magnetic memory bits are based on magnetic elements with a single easy axis of magnetization. When such elements are used in magnetic (magnetoresistive) random access memory (MRAM) devices based on magnetic tunneling junctions (MTJs), the elements give rise to two resistance states corresponding to parallel and anti-parallel configurations of the free and fixed magnetic layers in the junction, which can store one bit of information. One of the major challenges facing the MRAM industry is identifying routes for increasing the memory density. A conventional option is to decrease the magnetic bit size, but this option is associated with intrinsic obstacles, including superparamagnetism.

SUMMARY OF THE INVENTION

Aspects of the invention, in some embodiments thereof, relate to magnetoresistive memory. More specifically, aspects of the invention, in some embodiments thereof, relate to multi-state magnetoresistive memory.

A multi-state magnetoresistive random access memory device is positioned on a substrate and includes a fixed ferromagnetic region, a non-ferromagnetic spacer layer positioned on the fixed ferromagnetic region, and a free ferromagnetic region positioned on the non-ferromagnetic spacer layer. The fixed ferromagnetic region has a magnetic moment vector fixed along a preferred direction. The free ferromagnetic region is shaped as a multitude (N, defined as two or more) of symmetric ovals, each oval having a long axis. The ovals are disposed so as to share a center point and are spaced relative to one another along the angular direction such that the ovals mutually overlap in a center region of the shape. An aspect ratio of the free ferromagnetic region, defined as a ratio between a length of the long axis of each of the ovals and a diameter of the center region defined by the mutually overlapping ovals, is larger than 2. An angle between the preferred direction of the fixed magnetic moment and each of the long axes is non-zero. The free ferromagnetic region is configured to have a magnetic moment spontaneously aligned along the long axis in each oval outside the center region, and a center magnetic moment in the center region has a multitude of 2*N stable orientations, such orientations being determined by the magnetic moments in the ovals outside the center region.

According to some embodiments, the ovals are disposed equally spaced along the angular direction. According to some embodiments, N is selected from the group consisting of 2, 3, 4, 5 and 6. According to some embodiments the aspect ratio is greater than C, C being selected from the group consisting of 2.2, 2.5, 3, 3.5, 4, 4.5 and 5. According to some embodiments, the ovals are elliptic, which helps create a uniform magnetic field inside a ferromagnetic ellipsoid. Hence, an oval that sufficiently resembles an ellipse may be magnetized with a relatively uniform magnetic moment distribution, compared to other shapes that less resemble an ellipse.

According to some embodiments, the device further comprises a first electrode electrically associated with the fixed ferromagnetic region and a second electrode electrically associated with the free ferromagnetic region, wherein a voltage applied between the first electrode and the second electrode generates a tunneling current though the non-ferromagnetic spacer layer. An intensity of the tunneling current is affected by an angle between the center magnetic moment and the magnetic moment vector of the fixed magnetic region.

According to some embodiments, the device further comprises an electrically conducting layer that includes a heavy metal. The layer is disposed above the free ferromagnetic region and is electrically connected to the free ferromagnetic region. The electrically conducting layer is electrically associated with at least three writing electrodes. The electrodes are configured to induce in the electrically conducting layer electric currents distributions sufficient to affect a reversal of the magnetic moment in each of the ovals outside the center region. According to some embodiments, the magnetic moment reversal is affected by spin-transfer torque associated with spin-orbit interactions in the electrically conducting layer.

Certain embodiments of the present invention may include some, all, or none of the above advantages. Further advantages may be readily apparent to those skilled in the art from the figures, descriptions, and claims included herein. Aspects and embodiments of the invention are further described in the specification herein below and in the appended claims.

Unless otherwise defined, all technical and scientific terms used herein have the same meaning as commonly understood by one of ordinary skill in the art to which this invention pertains. In case of conflict, the patent specification, including definitions, governs. As used herein, the indefinite articles "a" and "an" mean "at least one" or "one or more" unless the context clearly dictates otherwise.

BRIEF DESCRIPTION OF THE FIGURES

Some embodiments of the invention are described herein with reference to the accompanying figures. The description, together with the figures, makes apparent to a person having ordinary skill in the art how some embodiments may be practiced. The figures are for the purpose of illustrative description and no attempt is made to show structural details of an embodiment in more detail than is necessary for a fundamental understanding of the invention. For the sake of clarity, some objects depicted in the figures are not to scale.

FIG. 1A schematically depicts a free ferromagnetic region having a shape anisotropy according to a preferred embodiment of the prior art;

FIG. 1B schematically depicts a free ferromagnetic region having a shape anisotropy according to another embodiment of the prior art;

FIG. 2A schematically depicts, in a cross-sectional view, an embodiment of a multi-state magnetoresistive random access memory (MMRAM) device according to an aspect of the invention;

FIG. 2B schematically depicts the fixed ferromagnetic region and the free ferromagnetic region of the device of FIG. 2A in top view;

FIG. 3A-3F schematically depict magnetic moment distribution in six stable states, respectively, in an embodiment where a free ferromagnetic region has three symmetric ovals overlapping in a center region;

DETAILED DESCRIPTION

Figure 4:
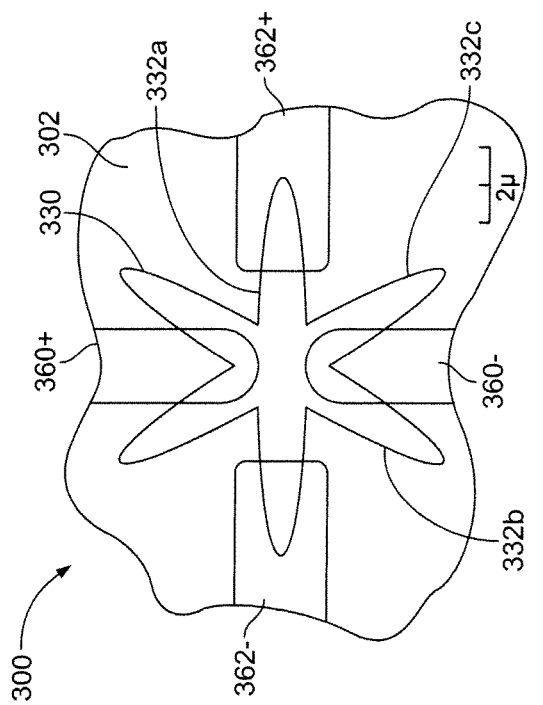
FIG. 4 schematically displays a SEM image of an embodiment of a test device comprising a free ferromagnetic region according to an aspect of the invention with attached voltage pads and current pads, for analysis using Planar Hall Effect (PHE) measurements.

The principles, uses and implementations of the teachings herein may be better understood with reference to the accompanying description and figures. Upon perusal of the description and figures present herein, one skilled in the art is able to implement the teachings herein without undue effort or experimentation.

To increase the number of memory states per element, the number of stable magnetic states needs to be increased. This may be achieved by controlling the shape of the device to achieve the desired magnetic anisotropy. Attempts have been made to provide a multi-state magnetoresistive random access memory device based on shape anisotropy of the free ferromagnetic region. For example, U.S. Pat. No. 7,095,646 (Patent '646) describes an anisotropic shape having "lobes", described by a polar equation given as $r_{(\theta)}=1+|A \cdot \cos(N\theta)|$, wherein N is a whole number greater than one, being approximately half the number of stable positions, theta is measured along the angular direction between 0 and 360 degrees, and A is a constant between 0.1 and 2.0.

FIG. 1A illustrates schematically a preferred embodiment of Patent '646 wherein N=2 and A=0.5. The resulting shape provides a relatively low ratio between the length of the lobes to the size of the central region defined by the lobes.

FIG. 1B illustrates schematically another embodiment of Patent '646 wherein N=3 and A=2 (generating the maximum aspect ratio taught by '646). Additionally, the lobes taught by Patent '646 tend to narrow down (the width decreases) towards the central region of the shape, which decreases the size of the free ferromagnetic region.

FIG. 2A schematically depicts, in a cross-sectional view, an embodiment of a multi-state magnetoresistive random access memory (MMRAM) device 100 positioned on a substrate 102, according to an aspect of the invention. Device 100 comprises a fixed ferromagnetic region 110, which includes a first ferromagnetic material, a non-ferromagnetic spacer layer 120 positioned on the fixed ferromagnetic region, and a free ferromagnetic region 130 comprising a second ferromagnetic material and positioned on the non-ferromagnetic spacer layer. In some embodiments, first ferromagnetic material and second ferromagnetic material are a soft ferromagnetic material, for example Permalloy®. Advantageously, these materials are already widely used in the magnetic electronics industry. In some embodiments, the non-ferromagnetic spacer layer 120 is made, for example, from an electrically isolating material, such as an electrically isolating metal oxide (e.g., but not limited to, magnesium oxide, aluminum oxide). In some embodiments, the device 100 is supported by a substrate 102 such that the device 100 is positioned directly on the substrate 102. In certain embodiments, the device 100 is positioned on the substrate 102 and is separated therefrom by an additional layer (not depicted) or an electrode (not depicted) configured to deliver current to the device positioned between device 100 and the substrate. When positioned on substrate 102, the fixed ferromagnetic region 110 is adjacent to the substrate such that the free ferromagnetic region 130 is on top, as schematically depicted in FIG. 2A. In certain embodiments, the free ferromagnetic region 130 is adjacent to the substrate such that the fixed ferromagnetic region 110 is on top.

FIG. 2B schematically depicts a fixed ferromagnetic region 110 (denoted FM1) and a free ferromagnetic region 130 (denoted FM2) in top view. The fixed ferromagnetic region 110 comprises a magnetic moment vector 112 fixed along a preferred direction. The free ferromagnetic region 130 is defined by multiple ovals. As shown, the free ferromagnetic region 130 is defined by three symmetric ovals 132a-c. Here, an oval means an elongated, rounded figure, having a long axis 134 extending between two apexes 136 and through a center point 138 of the oval. "Oval" herein further implies that a width of the oval—namely the distance from edge to edge perpendicular to the long axis 134a (e.g. the distance along lines 142)—does not decrease, and, in some embodiments, increases, towards the center point 138. An ellipse, a cross-section of an American football, or a racetrack (a rectangle with parallel sides and rounded edges) are examples of an oval as used herein. In some implementations, the ellipse is an elongated oval.

The ovals 132a-c are disposed so as to share the center points 138, and are rotated around the shared center point 138 so as to be spaced relative to one another along an angular direction. More specifically, as shown, the ovals are equally spaced along the angular direction, having an angle of 60 degrees between the long axes of neighboring ovals. Consequently, the ovals 132 are mutually overlapping in a center region 140 of the free ferromagnetic region 130. The center region 140 is included within, and defined by, the shape 144. The shape 144, in some embodiments, approximates a circle. For example, in some embodiments, the shape 144 is the largest circle fully included within free ferromagnetic region 130 around center point 138 such that the shape 144 approximates the largest circle capable of fitting into a shape defined by the set of points comprising the perimeter of the free ferromagnetic region 130.

An aspect ratio of the free ferromagnetic region 130 is defined as a ratio between a length of the long axis 134a and the diameter of shape 144 (e.g., the diameter of center region 140). The free ferromagnetic region 130 has an aspect ratio greater than 2, preferably greater than 2.2 or 2.5, even more preferably greater than 3 or 3.5 and even more preferably greater than 4 or 4.5 According to some embodiments, the free ferromagnetic region 130 and the fixed ferromagnetic region 110 are mutually aligned relative to one another so that an angle (denoted beta in FIG. 2) between the direction of the fixed magnetic moment 112 of the fixed ferromagnetic region 110 and each of the long axes 134 is non-zero. According to some embodiments, the free ferromagnetic region 130 and the fixed ferromagnetic region 110 are mutually aligned so that a projection of each of the long axes 134a on the X direction yields a unique result.

Device 100 of FIG. 2A, in view of the teachings of FIG. 2B, may be implemented as a magnetic tunneling junction (MTJ) and consequently be used as a multi-state magnetoresistive random access memory.

In an example implementation, the electrical resistance to tunneling current through the non-ferromagnetic spacer layer 120 is dependent on the mutual orientations of the magnetic moment from both sides of layer 120, namely on the mutual orientation of the magnetic moment in fixed ferromagnetic region 110 and in free ferromagnetic region 130. More specifically, tunneling current in device 100 is restricted to pass through the free ferromagnetic region 130 only via center region 140 thereof. Consequently the resistance is dictated by the magnetic moment in the center region (and not by the magnetic moment in other parts of the free ferromagnetic region 130, particularly not by the magnetic moment in the ovals outside the center region). The electrical resistance R to such tunneling current as a function of the mutual angle beta is $R_{(\beta)}=R_{AV-1/2}\Delta R \cos \beta$, where $R_{AV}=1/2\Delta R(R_P+R_{AP})$ and $\Delta R=R_{AP}-R_p$, where $R_P$ is the resistance of the junction when the magnetic moments are parallel, and $R_{AP}$ is the resistance of the junction when the magnetic moments are anti-parallel.

Device 100 thus possesses six directions of easy magnetization in FM2, each having a unique angular orientation relative to the magnetic moment in FM1 (namely, to the X axis). Thus, advantageously, device 100 has six different well-distributed values of resistance corresponding to an angle beta of 15°, 75°, 135°, 195°, 255° and 315°. Advantageously, the separation between the six resistance values is sufficiently large for a memory readout. Device 100 therefore constitutes a six state memory. It should be understood to the person skilled in the art that the absolute value of the junction's resistance may depend on several factors, including the precise geometries of the fixed magnetic region and the free ferromagnetic region, and the thickness and the material of the non-ferromagnetic layer in between. Practically, $\Delta R$ is on the order of kilo-ohms, rendering the various resistance states distinguishable. A method for "reading" the multi-state memory devise (that is to say—identifying the immediate magnetic state of the memory device from all the stable magnetic states) may therefore include for example: A. Applying a pre-determined (controlled) electric current to the magnetic tunnel junction, namely between the fixed ferromagnetic region and the free ferromagnetic region through the nonferromagnetic layer; and (B) measuring the resulting voltage across the magnetic tunnel junction, namely the voltage between fixed ferromagnetic region and the free ferromagnetic region. The magnetic tunnel junction resistance (the measured voltage divided by the predetermined current) indicates the magnetic state of the free ferromagnetic region and hence the information bit registered in the memory device. It is noted that electrical currents weaker than 1 mA—possibly weaker by an order of magnitude or more—may be suitable to generate junction voltages that are easily distinguishable according of the magnetic state of the device.

It should be noted that devices with a larger number of states (resulting from a larger number of overlapping ovals in FM2) constitute a correspondingly larger number of memory states. For instance, a device comprising a free ferromagnetic region (FM2) structure composed of four crossing elongated ellipses with an angle of 45° between the major axes of any two neighboring ellipses has in its center four easy axes. Using such a structure for FM2 in MTJ would thus yield an element with eight memory states, provided it is properly oriented relative to the easy axis of FM1.

According to some embodiments, information may be written to a multistate memory device by transferring spin-angular momentum from an electrical current to the free ferromagnetic region. This mechanism is distinct, and generally advantageous, over the method of using applied fields from neighboring current carrying wires, as described, for disturbance of nearby magnetic elements, limiting magnetic element density and thus magnetic storage density. Further, large currents (1 to 10 mA) are typically needed to generate magnetic fields sufficient to reorient the magnetization of a multistate memory (and thus write information thereto), leading to energy waste and heat removal problems.

Some embodiments of the present invention use spin-transfer torques associated with spin-orbit interactions for re-orienting the magnetic field in the free magnetic region, and thereby writing information to the memory device. Spin-transfer torques refers to a mechanism in which current flowing in a heavy metal (e.g. Pt, Ta or W) generates a spin accumulation (or equivalently a spin polarization) that interacts with the magnetization of an adjacent ferromagnetic region to induce magnetization switching. The physical mechanism that produces this spin-accumulation is a coupling between the spin and orbital motion of electrons in the heavy metal. Exemplary microscopic mechanisms that can produce a coupling between the spin and orbital motion of electrons in a conductor include: coupling which may occur when electrons scatter from impurities in the metal or lattice vibrations or may be intrinsic to the electronic states in the material, i.e. associated with the electronic band structure of the metal. The coupling may additionally or alternatively occur in the bulk of a material or at its surfaces and interfaces. This effect of coupling is generally referred to herein as the spin-Hall effect (although when it occurs at an interface and is intrinsic to that interface, it is sometimes termed the Rashba effect).

A measure of the magnitude of the coupling between spin and orbital motion in the heavy metal is the ratio of the spin angular momentum to electrical charge flow, known as the spin-Hall angle or spin-Hall coefficient. The spin-Hall angle or spin-Hall coefficient is a measure of the strength of the coupling irrespective of the microscopic mechanism that produces the coupling. Materials such a Pt, β-phase Ta and β-phase W have all been shown in experiment to exhibit large spin-Hall coefficients and thus to generate large spin-transfer torques per unit charge current flow. In addition, the spin-Hall coefficients of these elements can be increased by alloying or doping these elements with other heavy metals, such as metals from the rare earth section of the periodic table. As an example, Pt doped with Hf is found to have a larger spin-Hall coefficient than Pt itself. Materials that are insulating in their bulk (interior) with large spin-orbit coupling may have surface states that are conducting. These materials are known as topological insulators and have been shown to produce large spin-transfer torques on adjacent ferromagnetic layers. An example of a topological insulating material is $Bi_2Se_3$.

FIG. 3A-3F schematically depict magnetic moment distribution in an embodiment where a free ferromagnetic region 230 comprises three symmetric ovals 238, each oval arranged around a center region 240. Ovals in the free ferromagnetic region 230 are shaped as ellipses and are equally spaced along the angular direction, having a 60 degree angle between their respective long axes. The aspect ratio of the free ferromagnetic region 230 is 4.5. Micromagnetic simulations using an object-oriented micromagnetic framework (OOMMF) confirm that while away from the center there are two remanent magnetic orientations parallel to the long axis of the corresponding ellipse, in the center of the structure (crossing area) there are six distinct remanent orientations, corresponding to three easy axes of magnetization parallel to the major axes of the ellipses.

Referring further to FIG. 3A-3F, FIG. 3A-3F schematically depict the magnetic moment distribution in six different stable states, respectively. By a stable state it is meant that the state represents a local minimum of the internal energy in states space, namely that the magnetic moment distribution in the stable state may be obtained spontaneously. The magnetic moment distribution in each oval outside the center region is highly uniform and aligns accurately along the direction of the long axis of the oval in the same direction on both sides of the center region. Arrows 258a, 258b and 258c indicate the direction of magnetic moment in each oval 232a, 232b and 232c, respectively, outside the center region 240. Arrow 260 indicates the direction of the magnetic moment in the center region 240, around the center point of the free ferromagnetic region 230. In all the six stable states depicted in Figures FIG. 3A-3F, the direction of the magnetic moment in the center region 240, as indicated by the arrow 260, is aligned along the average direction of the magnetic moments in the ovals, as indicated by the arrows 258.

FIG. 4 schematically portrays a SEM image of an embodiment of a device 300 comprising a free ferromagnetic region 330 according to an aspect of the invention, deposited on a silicon (Si) substrate 302. The magnetic state in the central area of the structures was evaluated using Planar Hall Effect (PHE). External Helmholtz coils (not shown here) were used for providing a homogeneous magnetic field parallel to the plane of the Figure. Permalloy® films capped with tantalum were sputtered in a UHV-Evaporation and Sputtering system (BESTEC) on the substrate. Overlapping ellipse-shaped ovals 332a-c (comprised of the Permalloy® material) were patterned with ebeam High Resolution Lithography System (CRESTEC) using lift-off. Current pads 360 and voltage pads 362 were deposited on top of the ovals 332a-c. The measurements were performed at stabilized room temperature. To stabilize the temperature, a Peltier plate controlled by a Lakeshore 340 temperature controller was used. Current was delivered between the current pads 360+ and 362− parallel to the short axis of the horizontal oval 332a, and transverse voltage was delivered between voltage pads 362+ and 362− across the oval 332a.

Figure 5:
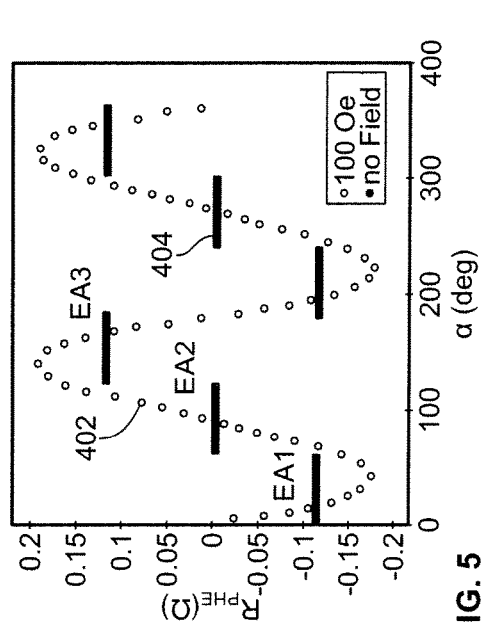
FIG. 5 schematically depicts a graph showing the planar Hall effect resistance RPHE as a function of the angle between the applied magnetic field and the current in the device of FIG. 4.

FIG. 5 shows the PHE resistance RPHE, which is the measured transverse voltage (voltage between voltage pads 362+ and 362−) divided by the current, as a function of the angle alpha between the applied magnetic field and the current. PHE measurements are used to probe the magnetization of the crossing area of the device 300.

For each angle alpha, depicted on the X-axis, RPHE is measured with an applied magnetic field and then without an applied magnetic field. Open partial circles 402 indicate RPHE under an applied field of 100 Oe. Full circles 404 indicate RPHE when the applied field is turned off. The remanent (residual magnetization) state indicates three distinct plateaus associated with three easy axes of magnetization denoted EA1, EA2 and EA3. Relative to the current leads, the three easy axes are positioned at 30°, 90° and −30°. The easy axes are parallel to the long axes of the ellipse-shaped ovals 332a-c.

Figure 6:
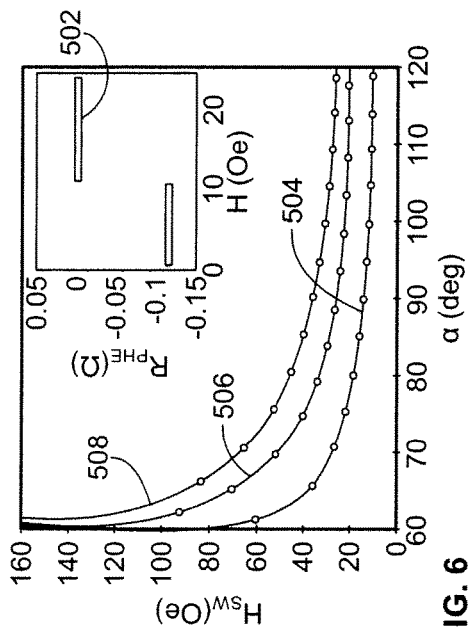
FIG. 6 schematically depicts a graph showing results of a switching experiment between remanent states performed on three sample devices such as the device of FIG. 4.

FIG. 6 shows the results of a switching test between remanent states, the test performed on three sample devices, such as device 300 shown in FIG. 4. Switching behavior, and in particular switching between remanent states, is an important characteristic of such devices.

In FIG. 6, the samples (A), (B) and (C) are characterized by ellipses, each having a long axis of 8000 nm, a short axis of 1000 nm and the thicknesses of about 10 nm, 15 nm and 20 nm, respectively. Remanent magnetization was induced in the center region along EA1 (30° relative to the current) and a magnetic field was applied at an angle between alpha=60° to alpha=120°. The field was increased in steps and after each increase the field was set back to zero to probe the PHE in its remanent state. When switching occurred, the remanent PHE switched to the value corresponding to the remanent magnetization in the center state along EA2. The insert 502 shows sharp switching from EA1 to EA2. Measurements 504, 506 and 508 show the switching field as a function of alpha for the sample devices A, B and C, respectively.

Advantageously, remanent magnetic states are thermally stable at room temperature at least for days. In addition, the switching test described herein demonstrated that the error in the switching field is small and is determined by the field step used in the experiments.

Magnetic systems with three in-plane easy axes can be described by a Hamiltonian in the form of $H = K_3 \cos^2 3\theta - M_s H \cos(\alpha - \theta)$; where the $K_3$ term corresponds to the six-fold magnetic anisotropy and $M_s$ is the saturation magnetization. Such a term is found, for instance, in systems with a hexagonal structure. Advantageously, for a positive $K_3$, the easy axes of magnetization are identical to EA1, EA2, and EA3.

Figures 7A, 7B:
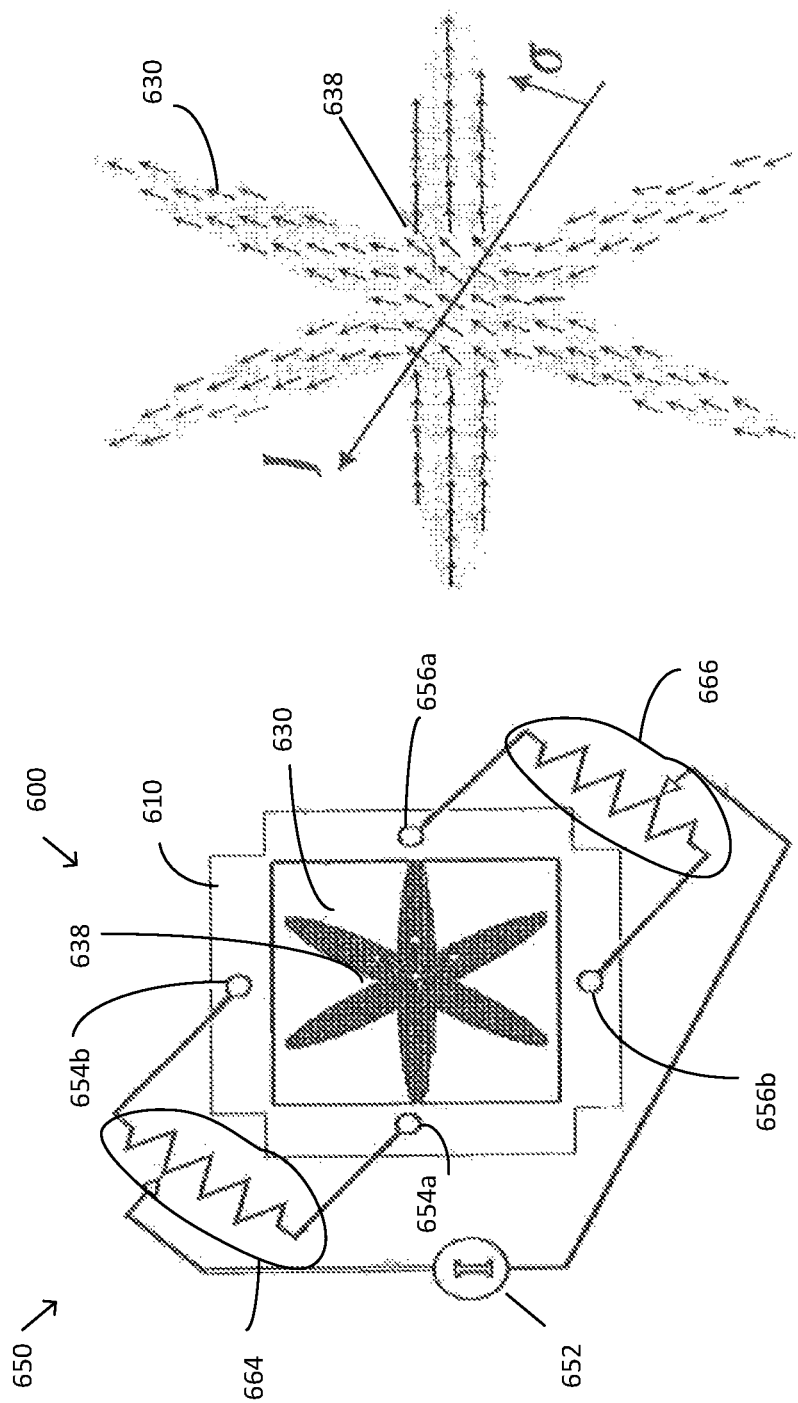
FIG. 7A illustrates schematically a device according to an aspect of the invention, configured to allow "writing" data bits into the memory of the device using spin-transfer torques, and FIG. 7B schematically depicts how spin polarization generated by the spin-Hall effect in the electrically conducting sheet of the device of FIG. 7A affects the magnetic moment in the center region of the free ferromagnetic region thereof.

FIG. 7A illustrates schematically a multi-state MRAM device 600 according to an aspect of the invention. Device 600 comprises an electrically conducting sheet 610 made of a heavy metal, and a free ferromagnetic region 630, electrically connected to electrically conducting sheet 610. The heavy metal may be, for example, tantalum, tungsten, platinum and the like. Device 600 further comprises a non-ferromagnetic layer disposed above free ferromagnetic region 630, and a fixed ferromagnetic layer disposed above the non-ferromagnetic layer (not shown), according to the description provided hereinabove. Device 600 is configured to allow "writing" data bits into the memory of the device by setting the magnetic moment in a center region 638 of free ferromagnetic region 630 using spin-transfer torques.

Device 600 is configured to have the magnetic moment in the center region 638 induced in a desired easy axis by driving an in-plane electric current in the electrically conducting sheet 610 such that the current direction is parallel to the plane of the sheet. An electric circuit 650 demonstrates an example suitable configuration. Electric circuit 650 comprises a current source 652, a first pair of contacts 654a and 654b and a second pair of contacts 656a and 656b. Electric circuit 650 further comprises two bias resistors 664 and 666, each being electrically coupled to the current source 652, and with one pair of contacts, 654 and 656, respectively. The contacts 654 and 656 are arranged on the electrically conducting sheet 610 so that contact 654a is positioned directly across the electrically conducting sheet 610 relative to contact 656a, and contact 654b is positioned directly across electrically conducting sheet 610 relative to contact 656b. By setting a suitable resistance distribution across bias resistors 664 and 666, the direction of the electric current through the electrically conducting sheet 610 may be determined.

FIG. 7B schematically depicts how spin polarization generated by the spin-Hall effect in electrically conducting sheet 610 affects the magnetic moment in the center region 638 of free ferromagnetic region 630. For practical use of such structures, it is necessary to consider how one would write information. In the example embodiment of FIG. 7, a method of storing information includes the use of spin-transfer torques associated with spin-orbit interactions. A current flowing in a heavy metal layer can generate a spin-polarization that interacts with the magnetization in an adjacent ferromagnetic layer and induces magnetization reversal.

The spin-orbit transfer (SOT) is given by $$\tau = \frac{\hbar \theta_{SH} J}{2eM_s t} m \times (m \times \sigma)$$

where $\theta_{SH}$ characterizes the charge to spin-current conversion efficiency, m is unit vector in the direction of magnetization, $\sigma$ is the spin polarization, J is the current density and t is the thickness of the magnetic layer of free ferromagnetic region 630. For example, $\theta_{SH}=-0.15$, characteristic of $\beta$Ta, and ellipse dimensions of $32\times256$ nm$^2$ that is 0.5 nm thick, to certify a desired aspect ratio. The Gilbert damping coefficient is assumed $\alpha=0.01$ and $M_s=8\times10^5$ A/m, characteristic of Permalloy®.

To switch between any of the six stable states, irrespective of the initial state, a desired final state can be achieved in the center region 638 of free ferromagnetic region 630 by flowing an in-plane current in the electrically conducting sheet 610 in a direction orthogonal to the average magnetization of the final state as schematically depicted in FIG. 7B. In the example embodiment, switching where the average magnetization rotates by $\pm\pi/3$, $\pm2\pi/3$ and $\pm\pi$ are obtained by pulse amplitudes greater than 46 MA/cm$^2$ and a duration of 5 ns. In some embodiments, multiple (>2) contacts to the spin-Hall material (in an example embodiment, tantalum) are included to permit the in-plane current direction to be varied.

For a single ellipse, the critical current for anti-damping switching in a macrospin model is $J_{c0}=e\alpha\mu_0M_s^2/(\hbar\theta_{SH})$, which is ~4 MA/cm$^2$ for the simulation parameters. The three ellipse structure has a switching current that is about one order of magnitude larger than this. This increase is associated with the fact that, in a three-ellipse embodiment, the spin-polarization angle varies between the axes of the ellipses, which reduces the average anti-damping component of the spin-torque.

Figure 7C:
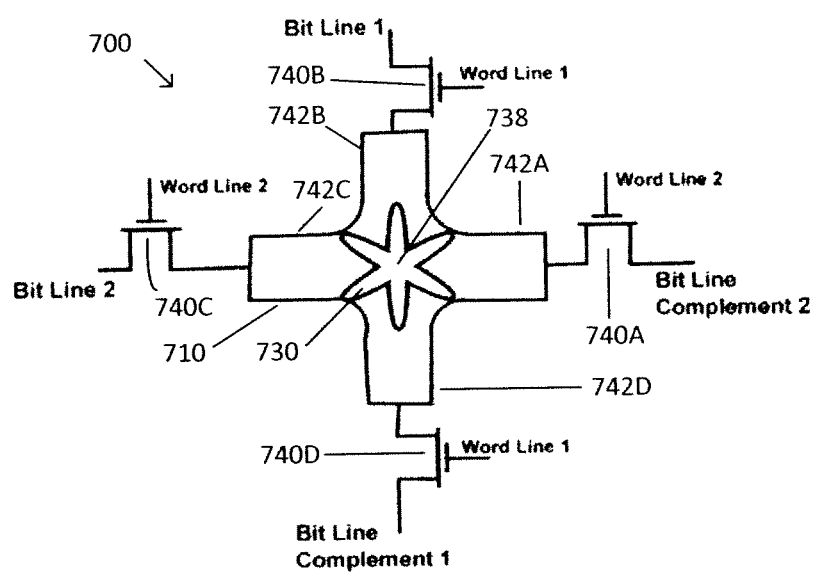
FIG. 7C shows a multi-state MRAM device configured for dynamic writing to the device by dynamically setting the magnetic polarization direction in the free magnetic region using spin-transfer torques.

FIG. 7C illustrates schematically a multi-state MRAM device 700 configured for dynamic "writing" to the device by dynamically setting the magnetic polarization direction in a free magnetic region 730 according to an aspect of the invention. Device 700 comprises an electrically conducting sheet 710 made of a material having large spin-Hall effect as described above, adjacent and electrically connected to free ferromagnetic region 730. Electrical switches (e.g. CMOS transistors) 740A, 740B, 7340C and 740D may be used to control current flow (magnitude and duration) through each of four poles 742A, 742B, 742C and 742D of electrically conducting sheet 710, respectively.

Using electrical switches 740, the direction of current flow in electrically conducting sheet 710 may be controlled dynamically to rapidly set the desired magnetic state of the free magnetic region. This may be accomplished, for example, by summing the current from two independent current sources (not shown in this Figure—connected between Bit Line 1 Bit 15 Line Complement 1 and between Bit Line 2 and Bit Line complement 2, respectively). By activating Word Line 2 (in switches 740C and 740A), current flow is in the x-direction, in the horizontal direction of the Figure. By activating Word Line 1 (in switches 740B and 740D), current flow is in the y-direction, in the vertical direction of the Figure. By activating both Word Line 1 and Word Line 2, the current in electrically conducting sheet 710 is a vector sum of the two currents and has a direction determined by the voltages on Bit Line 1 and Bit Line 2. Thus a desired state of the multistate memory is set by activating Bit and Word lines as well as setting the voltage levels on these lines, i.e. controlled by standard semiconductor circuitry (e.g. CMOS). According to some embodiments, switching in device 700, where the average magnetization rotates by $$\pm\frac{\pi}{3}, \pm\frac{2\pi}{3} \text{ and } \pm\pi,$$

may be obtained by pulse amplitudes greater than 46 MA/cm$^2$ and a duration of 5 ns. A method for "writing" to the multi-state memory devise (that is to say, setting a single desired magnetic state of the memory device among all the stable magnetic states) in an example embodiment therefore includes: (A) setting voltages on Bit Lines 1 and 2 in FIG. 7C. The voltages may be set to determine that current through any one of the poles 742A, 742B, 742C and 742D is positive (from a bit line to the respective bit line complementary) or negative (from a bit line complementary to the respective bit line). (B) applying a digital signal to either Word Line 1 or Word Line 2 or both simultaneously, depending on the information to be written, namely depending on the desired magnetic state of the multistate memory; and (C) removing the digital signals previously applied to Word Lines 1 and 2. Following the application of the current through the electrically conducting sheet, the magnetic state of the free ferromagnetic region is set to one of the stable states of the memory device, hence "writing" an information bit to the device.

Thus, according to an aspect of some embodiments there is provided a multistate memory device that is written by spin transfer torques generated by current flow within a region with a non-zero spin-Hall coefficient adjacent to the ferromagnetic region. According to some embodiments the region with a non-zero spin-Hall coefficient is a transition metal composed at least of Pt, Ta or W or a suitable combination thereof. According to some embodiments, the heavy metal comprises dopants. According to some embodiments, the dopants are selected from the rare earth elements. According to some embodiments the region with large spin-Hall coefficient is a topological insulator. According to some embodiments the direction of current flow and the current intensity through the region with non-zero spin-Hall coefficient determine or at least affect the state of the memory device. According to some embodiments the current flow direction is set by summing currents from at least two independent current sources. According to some embodiments the current is applied in the form of a pulse of duration of about 5 ns.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. No feature described in the context of an embodiment is to be considered an essential feature of that embodiment, unless explicitly specified as such.

Although steps of methods according to some embodiments may be described in a specific sequence, methods of the invention may comprise some or all of the described steps carried out in a different order. A method of the invention may comprise all of the steps described or only a few of the described steps. No particular step in a disclosed method is to be considered an essential step of that method, unless explicitly specified as such.

Although the invention is described in conjunction with specific embodiments thereof, it is evident that numerous alternatives, modifications and variations that are apparent to those skilled in the art may exist. Accordingly, the invention embraces all such alternatives, modifications and variations that fall within the scope of the appended claims. It is to be understood that the invention is not necessarily limited in its application to the details of construction and the arrangement of the components and/or methods set forth herein. Other embodiments may be practiced, and an embodiment may be carried out in various ways.

The phraseology and terminology employed herein are for descriptive purpose and should not be regarded as limiting. Citation or identification of any reference in this application shall not be construed as an admission that such reference is available as prior art to the invention. Section headings are used herein to ease understanding of the specification and should not be construed as necessarily limiting.

What is claimed is:

1. A multi-state magnetoresistive random access memory device positioned on a substrate, the device comprising:
    a fixed ferromagnetic region having a fixed magnetic moment vector;
    a non-ferromagnetic spacer layer positioned adjacent to the fixed ferromagnetic region;
    a free ferromagnetic region positioned on the non-ferromagnetic spacer layer, the free ferromagnetic region defined by a plurality of ovals, each oval in the plurality of ovals disposed in a mutually overlapping fashion so as to share a center point and define a center region, each oval spaced relative to other ovals in the plurality of ovals along an angular direction;
    wherein a ratio between a length of a long axis of each oval in the plurality of ovals and a diameter of the center region is larger than 2 and wherein a projection of each long axis of each oval in the plurality of ovals on the preferred direction of the fixed magnetic moment is unique;
    wherein the free ferromagnetic region is configured to have a magnetic moment spontaneously aligned along the long axis in each oval outside the center region, and a center magnetic moment in the center region has a multitude of exactly 2*N stable orientations determined by the magnetic moments in the ovals outside the center region.

2. The device of claim 1, wherein the ovals are equally spaced along the angular direction.

3. The device of claim 1, wherein N is a whole number equal to or greater than 2 and less than or equal to 6.

4. The device of claim 1, wherein the ratio is equal to or greater than 2.2.

5. The device of claim 1, wherein the ovals are elliptical.

6. The device of claim 1, wherein the non-ferromagnetic spacer layer is electrically isolating.

7. The device of claim 1, wherein the non-ferromagnetic spacer layer comprises a metal oxide.

8. The device of claim 1, further comprising a first electrode electrically coupled to the fixed ferromagnetic region and a second electrode electrically coupled to the free ferromagnetic region, wherein a voltage applied between the first electrode and the second electrode generates a tunneling current though the non-ferromagnetic spacer layer, intensity of said tunneling current determined by an angle between said center magnetic moment and said magnetic moment vector of said fixed magnetic region.

9. The device of claim 1, further comprising an electrically conducting layer comprising a heavy metal;
    wherein the electrically conducting layer is disposed above the free ferromagnetic region and electrically connected to the free ferromagnetic region; and
    wherein the electrically conducting layer is electrically associated with at least three electrodes configured to induce in the electrically conducting layer electrical current distributions sufficient to affect a reversal of the magnetic moment in each area located outside the center region of each of the ovals.

10. The device of claim 9, wherein the magnetic moment reversal is determined by spin-transfer torque associated with spin-orbit interactions in the electrically conducting layer.

11. The device of claim 9, wherein the heavy metal is selected from the group consisting of Pt, Ta and W.

12. The device of claim 9, wherein the electrically conducting layer includes a material doped with a rare-Earth element.

13. The device of claim 12, wherein the material of the electrically conducting layer comprises a topological insulator.

14. The device of claim 9, further comprising electronic switches electrically associated with the at least three electrodes and configured to control an amplitude and duration of the electrical currents through the electrically conducting layer.

15. The device of claim 14, wherein the electrical switches are configured to dynamically switch the electrical currents so as to allow writing information bits to the device at a rate of about 1 bit per 5 nsec.

16. A method of inducing multiple discrete stable magnetic states with multiple axes of magnetization in a magnetoresistive random access memory device, the method comprising:
    arranging a plurality of ferromagnetic films, comprising at least a first ferromagnetic film, a second ferromagnetic film, and a third ferromagnetic film each having a long axis, in an overlapping fashion to define a circular center region and a free ferromagnetic region; and spacing each of the plurality of ferromagnetic films along an angular direction such that a center point is shared among the plurality of ferromagnetic films and the plurality of ferromagnetic films collectively exhibit at least six stable magnetic states with at least three easy axes of magnetization;

wherein a ratio between a length of the long axis of each of the plurality of ferromagnetic films and a diameter of the center region is higher than 2.

17. The method of claim 16, further comprising switching between any of the six stable states by:

positioning the plurality of ferromagnetic films adjacent to an electrically conducting layer comprising a heavy metal such that the electrically conducting layer is electrically connected to the free ferromagnetic region; and inducing in the electrically conducting layer electric current distributions sufficient to affect a reversal of the magnetic moment in the free ferromagnetic region;

wherein the magnetic moment reversal is determined by spin-transfer torque associated with spin-orbit interactions in the electrically conducting layer.

18. The method of claim 16, further comprising:

defining a desired final stable magnetic state;

calculating average magnetization of the final stable magnetic state;

flowing an in-plane current in the electrically conducting layer in a direction orthogonal to the average magnetization of the final stable magnetic state.

19. The method of claim 18, further comprising electrically connecting the electrically conducting layer to the free ferromagnetic region using at least three electrodes such that the in-plane current direction is capable of being varied.

20. The method of claim 18, further comprising modulating the electric current to achieve the final stable magnetic state.

* * * * *

UNITED STATES PATENT AND TRADEMARK OFFICE
CERTIFICATE OF CORRECTION

PATENT NO. : 10,204,678 B2
APPLICATION NO. : 15/466657
DATED : February 12, 2019
INVENTOR(S) : Klein et al.

Page 1 of 1

It is certified that error appears in the above-identified patent and that said Letters Patent is hereby corrected as shown below:

In the Specification

Column 1, Line 16 should read:
--STATEMENT REGARDING FEDERALLY SPONSORED RESEARCH OR DEVELOPMENT
This invention was made with government support under grant no. 1309202 awarded by the
National Science Foundation. The government has certain rights in the invention.--

Signed and Sealed this
Ninth Day of July, 2019

Andrei Iancu
*Director of the United States Patent and Trademark Office*